US010976491B2

(12) United States Patent
Coolbaugh et al.

(10) Patent No.: US 10,976,491 B2
(45) Date of Patent: Apr. 13, 2021

(54) PHOTONICS INTERPOSER OPTOELECTRONICS

(71) Applicants: The Research Foundation for The State University of New York, Albany, NY (US); The Trustees of Columbia University in the City of New York, New York, NY (US); Analog Photonics, LLC, Boston, MA (US); Arizona Board of Regents on behalf of the University of Arizona, Tucson, AZ (US)

(72) Inventors: Douglas Coolbaugh, Albany, NY (US); Michael Watts, Boston, MA (US); Michal Lipson, New York, NY (US); Keren Bergman, New York, NY (US); Thomas Koch, Tucson, AZ (US); Jeremiah Hebding, Albany, NY (US); Daniel Pascual, Albany, NY (US); Douglas La Tulipe, Albany, NY (US)

(73) Assignees: THE RESEARCH FOUNDATION FOR THE STATE UNIVERSITY OF NEW YORK, Albany, NY (US); THE TRUSTEES OF COLUMBIA UNIVERSITY IN THE CITY OF NEW YORK, New York, NY (US); ANALOG PHOTONICS, LLC, Boston, MA (US); ARIZONA BOARD OF REGENTS ON BEHALF OF THE UNIVERSITY OF ARIZONA, Tucson, AZ (US)

( * ) Notice: Subject to any disclaimer, the term of this patent is extended or adjusted under 35 U.S.C. 154(b) by 87 days.

(21) Appl. No.: 15/795,349

(22) Filed: Oct. 27, 2017

(65) Prior Publication Data

US 2018/0143374 A1 May 24, 2018

Related U.S. Application Data

(60) Provisional application No. 62/426,100, filed on Nov. 23, 2016.

(51) Int. Cl.
*G02B 6/122* (2006.01)
*G02B 6/136* (2006.01)
(Continued)

(52) U.S. Cl.
CPC ............. *G02B 6/122* (2013.01); *G02B 6/132* (2013.01); *G02B 6/136* (2013.01); *H01L 21/486* (2013.01);
(Continued)

(58) Field of Classification Search
CPC .................................................. G02B 6/12004
See application file for complete search history.

(56) References Cited

U.S. PATENT DOCUMENTS 5,841,931 A    11/1998   Foresi et al.
6,108,464 A     8/2000   Foresi et al.
(Continued)

FOREIGN PATENT DOCUMENTS

| CN | 103650140 A | 3/2014 |
|---|---|---|
| WO | WO2016/050243 A1 | 4/2016 |
| WO | WO 2016050243 A1 | 4/2016 |

OTHER PUBLICATIONS

Y. Mingbin et al. "*3D Electro-Optical Integration Based on High-Performance Si Photonics TSV Interposer*" 2016 Optical Fiber Communications Conference and Exhibition (OFC), OSA, pp. 1-3, Mar. 20, 2016.
(Continued)

*Primary Examiner* — Ryan A Lepisto
*Assistant Examiner* — Erin D Chiem
(74) *Attorney, Agent, or Firm* — George S. Blasiak; Heslin Rothenberg Farley & Mesiti PC

(57) ABSTRACT

In one embodiment an optoelectronic system can include a photonics interposer having a substrate and a functional interposer structure formed on the substrate, a plurality of
(Continued)

through vias carrying electrical signals extending through the substrate and the functional interposer structure, and a plurality of wires carrying signals to different areas of the functional interposer structure. The system can further include one or more photonics device integrally formed in the functional interposer structure, and one or more prefabricated component attached to the functional interposer structure.

20 Claims, 7 Drawing Sheets

(51) Int. Cl.
G02B 6/132 (2006.01)
H01L 23/498 (2006.01)
H01S 5/22 (2006.01)
H01L 21/48 (2006.01)
H01L 23/13 (2006.01)
G02B 6/42 (2006.01)
G02B 6/30 (2006.01)
G02B 6/43 (2006.01)
H01S 5/022 (2021.01)
G02B 6/12 (2006.01)

(52) U.S. Cl.
CPC .......... H01L 21/4857 (2013.01); H01L 23/13 (2013.01); H01L 23/49822 (2013.01); H01S 5/02248 (2013.01); H01S 5/02284 (2013.01); G02B 6/30 (2013.01); G02B 6/428 (2013.01); G02B 6/4245 (2013.01); G02B 6/43 (2013.01); G02B 2006/12061 (2013.01); H01S 5/02236 (2013.01); H01S 5/02276 (2013.01)

(56) References Cited

U.S. PATENT DOCUMENTS

| | | |
|---|---|---|
| 6,621,972 B2 | 9/2003 | Kimerling et al. |
| 6,631,225 B2 | 10/2003 | Lee et al. |
| 6,635,110 B1 | 10/2003 | Luan et al. |
| 6,690,871 B2 | 2/2004 | Lee et al. |
| 6,697,551 B2 | 2/2004 | Lee et al. |
| 6,812,495 B2 | 11/2004 | Wada et al. |
| 6,850,683 B2 | 2/2005 | Lee et al. |
| 6,879,014 B2 | 4/2005 | Wagner et al. |
| 6,884,636 B2 | 4/2005 | Fiorini et al. |
| 6,887,773 B2 | 5/2005 | Gunn, III et al. |
| 6,927,392 B2 | 8/2005 | Liddiard |
| 6,946,318 B2 | 9/2005 | Wada et al. |
| 7,008,813 B1 | 3/2006 | Lee et al. |
| 7,043,120 B2 | 5/2006 | Wada et al. |
| 7,075,081 B2 | 7/2006 | Fiorini et al. |
| 7,095,010 B2 | 8/2006 | Scherer et al. |
| 7,103,245 B2 | 9/2006 | Lee et al. |
| 7,123,805 B2 | 10/2006 | Sparacin et al. |
| 7,186,611 B2 | 3/2007 | Hsu et al. |
| 7,190,871 B2 | 3/2007 | Lock et al. |
| 7,194,166 B1 | 3/2007 | Gunn, III et al. |
| 7,248,757 B2 * | 7/2007 | Iwasaki .............. G02B 6/43 385/14 |
| 7,251,386 B1 | 7/2007 | Dickinson et al. |
| 7,259,031 B1 | 8/2007 | Dickinson et al. |
| 7,262,117 B1 | 8/2007 | Gunn, III et al. |
| 7,266,263 B2 | 9/2007 | Ahn et al. |
| 7,279,682 B2 | 10/2007 | Ouvrier-Buffet et al. |
| 7,305,157 B2 | 12/2007 | Ahn et al. |
| 7,317,242 B2 | 1/2008 | Takizawa |
| 7,320,896 B2 | 1/2008 | Fiorini et al. |
| 7,321,713 B2 | 1/2008 | Akiyama et al. |
| 7,340,709 B1 | 3/2008 | Masini et al. |
| 7,358,527 B1 | 4/2008 | Masini et al. |
| 7,389,029 B2 | 6/2008 | Rahman et al. |
| 7,397,101 B1 | 7/2008 | Masini et al. |
| 7,424,181 B2 | 9/2008 | Haus et al. |
| 7,453,129 B2 | 11/2008 | King et al. |
| 7,453,132 B1 | 11/2008 | Gunn, III et al. |
| 7,459,686 B2 | 12/2008 | Syllaios et al. |
| 7,480,430 B2 | 1/2009 | Saini et al. |
| 7,508,050 B1 | 3/2009 | Pei et al. |
| 7,565,046 B2 | 7/2009 | Feng et al. |
| 7,613,369 B2 | 11/2009 | Witzens et al. |
| 7,616,904 B1 | 11/2009 | Gunn, III et al. |
| 7,651,880 B2 | 1/2010 | Tweet et al. |
| 7,659,627 B2 | 2/2010 | Miyachi et al. |
| 7,700,975 B2 | 4/2010 | Rakshit et al. |
| 7,723,206 B2 | 5/2010 | Miyachi et al. |
| 7,723,754 B2 | 5/2010 | Wada et al. |
| 7,736,734 B2 | 6/2010 | Carothers et al. |
| 7,737,534 B2 | 6/2010 | McLaughlin et al. |
| 7,754,540 B2 | 7/2010 | Vashchenko et al. |
| 7,767,499 B2 | 8/2010 | Herner |
| 7,773,836 B2 | 8/2010 | De Dobbelaere |
| 7,790,495 B2 | 9/2010 | Assefa et al. |
| 7,801,406 B2 | 9/2010 | Pan et al. |
| 7,812,404 B2 | 10/2010 | Herner et al. |
| 7,816,767 B2 | 10/2010 | Pei et al. |
| 7,831,123 B2 | 11/2010 | Sparacin et al. |
| 7,961,992 B2 | 1/2011 | De Dobbelaere et al. |
| 7,902,620 B2 | 3/2011 | Assefa et al. |
| 7,906,825 B2 | 3/2011 | Tweet et al. |
| 7,916,377 B2 | 3/2011 | Witzens et al. |
| 7,943,471 B1 | 5/2011 | Bauer et al. |
| 7,973,377 B2 | 7/2011 | King et al. |
| 7,994,066 B1 | 8/2011 | Capellini et al. |
| 7,999,344 B2 | 8/2011 | Assefa et al. |
| 8,030,668 B2 | 10/2011 | Hisamoto et al. |
| 8,121,447 B2 | 2/2012 | De Dobbelaere et al. |
| 8,165,431 B2 | 4/2012 | De Dobbelaere et al. |
| 8,168,939 B2 | 5/2012 | Mack et al. |
| 8,178,382 B2 | 5/2012 | Assefa et al. |
| 8,188,512 B2 | 5/2012 | Kim et al. |
| 8,213,751 B1 * | 7/2012 | Ho .......................... G02B 6/43 385/1 |
| 8,227,787 B2 | 7/2012 | Kumar et al. |
| 8,238,014 B2 | 8/2012 | Kucharski et al. |
| 8,289,067 B2 | 10/2012 | Kucharski et al. |
| 8,304,272 B2 | 11/2012 | Assefa et al. |
| 8,343,792 B2 | 1/2013 | Carothers et al. |
| 8,354,282 B2 | 1/2013 | Stern |
| 8,358,940 B2 | 1/2013 | Kucharski et al. |
| 8,399,949 B2 | 3/2013 | Meade |
| 8,440,989 B2 | 5/2013 | Mack et al. |
| 8,455,292 B2 | 6/2013 | Assefa et al. |
| 8,471,639 B2 | 6/2013 | Welch |
| 8,577,191 B2 | 11/2013 | De Dobbelaere et al. |
| 8,592,745 B2 | 11/2013 | Masini et al. |
| 8,604,866 B2 | 12/2013 | Kucharski et al. |
| 8,614,116 B2 | 12/2013 | Assefa et al. |
| 8,625,935 B2 | 1/2014 | Mekis et al. |
| 8,626,002 B2 | 1/2014 | Kucharski et al. |
| 8,633,067 B2 | 1/2014 | Assefa et al. |
| 8,649,639 B2 | 2/2014 | Mekis et al. |
| 8,664,739 B2 | 3/2014 | King et al. |
| 8,665,508 B2 | 3/2014 | Kucharski et al. |
| RE44,829 E | 4/2014 | De Dobbelaere et al. |
| 8,698,271 B2 | 4/2014 | Suh et al. |
| 8,742,398 B2 | 6/2014 | Klem et al. |
| 8,754,711 B2 | 6/2014 | Welch |
| 8,772,704 B2 | 7/2014 | Mack et al. |
| 8,787,774 B2 | 7/2014 | Guckenberger |
| 8,798,476 B2 | 8/2014 | Gloeckner et al. |
| RE45,214 E | 10/2014 | De Dobbelaere et al. |
| RE45,215 E | 10/2014 | De Dobbelaere et al. |
| 8,877,616 B2 | 11/2014 | Pinguet et al. |
| 8,895,413 B2 | 11/2014 | Pinguet et al. |
| 8,923,664 B2 | 12/2014 | Mekis et al. |
| RE45,390 E | 2/2015 | De Dobbelaere et al. |
| 9,046,650 B2 | 6/2015 | Lin et al. |
| 9,053,980 B2 | 6/2015 | Pinguet et al. |
| 9,091,827 B2 | 7/2015 | Verslegers et al. |
| 9,110,221 B2 | 8/2015 | Agarwal et al. |

(56) References Cited

U.S. PATENT DOCUMENTS

| | | | |
|---|---|---|---|
| 9,851,506 B2* | 12/2017 | Shi | G02B 6/132 |
| 9,874,693 B2 | 1/2018 | Baiocco et al. | |
| 2003/0215203 A1 | 11/2003 | Lock et al. | |
| 2004/0091719 A1* | 5/2004 | Uchida | H05K 1/0274 |
| | | | 428/429 |
| 2005/0012040 A1 | 1/2005 | Fiorini et al. | |
| 2005/0051705 A1 | 3/2005 | Yasaitis | |
| 2005/0101084 A1 | 5/2005 | Gilton | |
| 2005/0205954 A1 | 9/2005 | King et al. | |
| 2006/0110844 A1 | 5/2006 | Lee et al. | |
| 2006/0194357 A1 | 8/2006 | Hsu et al. | |
| 2006/0243973 A1 | 11/2006 | Gilton | |
| 2006/0249753 A1 | 11/2006 | Herner | |
| 2006/0250836 A1 | 11/2006 | Herner et al. | |
| 2006/0250837 A1 | 11/2006 | Herner | |
| 2006/0289764 A1 | 12/2006 | Fiorini et al. | |
| 2007/0034978 A1 | 2/2007 | Pratte et al. | |
| 2007/0090089 A1 | 4/2007 | Chang et al. | |
| 2007/0099329 A1 | 5/2007 | Maa et al. | |
| 2007/0104410 A1 | 5/2007 | Ahn et al. | |
| 2007/0141744 A1 | 6/2007 | Lee et al. | |
| 2007/0170536 A1 | 7/2007 | Hsu et al. | |
| 2007/0190722 A1 | 8/2007 | Herner | |
| 2007/0228414 A1 | 10/2007 | Kumar et al. | |
| 2007/0246764 A1 | 10/2007 | Herner | |
| 2007/0262296 A1 | 11/2007 | Bauer | |
| 2008/0121805 A1 | 5/2008 | Tweet et al. | |
| 2008/0157253 A1 | 7/2008 | Starikov et al. | |
| 2008/0217651 A1 | 9/2008 | Liu et al. | |
| 2008/0239787 A1 | 10/2008 | Herner | |
| 2008/0311696 A1 | 12/2008 | Chee-Wee et al. | |
| 2008/0316795 A1 | 12/2008 | Herner | |
| 2008/0318397 A1 | 12/2008 | Herner | |
| 2009/0032814 A1 | 2/2009 | Vashchenko et al. | |
| 2009/0196631 A1 | 8/2009 | Daghighian et al. | |
| 2010/0006961 A1 | 1/2010 | Yasaitis | |
| 2010/0031992 A1 | 2/2010 | Hsu | |
| 2010/0090110 A1 | 4/2010 | Tweet et al. | |
| 2010/0102412 A1 | 4/2010 | Suh et al. | |
| 2010/0133536 A1 | 6/2010 | Syllaios et al. | |
| 2010/0133585 A1 | 6/2010 | Kim et al. | |
| 2010/0151619 A1 | 6/2010 | Yasaitis | |
| 2010/0213561 A1 | 8/2010 | Assefa et al. | |
| 2010/0276776 A1 | 11/2010 | Lee et al. | |
| 2010/0302836 A1 | 12/2010 | Herner | |
| 2011/0012221 A1 | 1/2011 | Fukikata et al. | |
| 2011/0027950 A1 | 2/2011 | Jones et al. | |
| 2011/0156183 A1 | 6/2011 | Liu | |
| 2011/0163404 A1 | 7/2011 | Lee et al. | |
| 2011/0227116 A1 | 9/2011 | Saito et al. | |
| 2012/0001283 A1 | 1/2012 | Assefa et al. | |
| 2012/0025212 A1 | 2/2012 | Kouvctakis et al. | |
| 2012/0129302 A1 | 5/2012 | Assefa et al. | |
| 2012/0187280 A1 | 7/2012 | Kerness et al. | |
| 2012/0193636 A1 | 8/2012 | Stern | |
| 2012/0280344 A1 | 11/2012 | Shastri et al. | |
| 2012/0288971 A1 | 11/2012 | Boagaerts et al. | |
| 2012/0288992 A1 | 11/2012 | Assefa et al. | |
| 2012/0299143 A1 | 11/2012 | Stern | |
| 2012/0301149 A1 | 11/2012 | Pinguet et al. | |
| 2013/0065349 A1 | 3/2013 | Assefa et al. | |
| 2013/0154042 A1 | 6/2013 | Meade | |
| 2013/0156364 A1* | 6/2013 | Chen | G02B 6/12004 |
| | | | 385/14 |
| 2013/0202005 A1 | 8/2013 | Dutt | |
| 2013/0214160 A1 | 8/2013 | Cazaux et al. | |
| 2013/0228886 A1 | 9/2013 | JangJian et al. | |
| 2013/0284889 A1 | 10/2013 | Giffard et al. | |
| 2013/0313579 A1 | 11/2013 | Kouvetakis et al. | |
| 2013/0328145 A1 | 12/2013 | Liu et al. | |
| 2014/0008750 A1 | 1/2014 | Feshali et al. | |
| 2014/0027826 A1 | 1/2014 | Assefa et al. | |
| 2014/0029892 A1 | 1/2014 | Pomerene et al. | |
| 2014/0042463 A1 | 2/2014 | Uemura et al. | |
| 2014/0080269 A1 | 3/2014 | Assefa et al. | |
| 2014/0124669 A1 | 5/2014 | Zheng et al. | |
| 2014/0131733 A1 | 5/2014 | Meade | |
| 2014/0134789 A1 | 5/2014 | Assefa et al. | |
| 2014/0134790 A1 | 5/2014 | Assefa et al. | |
| 2014/0159129 A1 | 6/2014 | Wang et al. | |
| 2014/0175510 A1 | 6/2014 | Suh et al. | |
| 2014/0203325 A1 | 7/2014 | Verma et al. | |
| 2014/0209985 A1 | 7/2014 | Assefa et al. | |
| 2016/0197111 A1 | 7/2016 | Coolbaugh et al. | |
| 2016/0223749 A1 | 8/2016 | Coolbaugh et al. | |
| 2016/0291265 A1* | 10/2016 | Kinghorn | H01L 25/162 |
| 2017/0047312 A1* | 2/2017 | Budd | H01L 25/117 |
| 2018/0143374 A1 | 5/2018 | Coolbaugh et al. | |
| 2018/0314003 A1 | 11/2018 | Coolbaugh et al. | |
| 2019/0025513 A1 | 1/2019 | Coolbaugh et al. | |
| 2019/0146151 A1 | 5/2019 | Meister et al. | |

OTHER PUBLICATIONS

P. De Dobbelaere, et al. "*Packaging of Silicon Photonics Systems,*" Optical Fiber Communication Conference, p. W31.2, Washington D.C., Jan. 1, 2014.

International Search Report for International Application No. PCT/US2017/062773 filed Nov. 21, 2017, dated Mar. 21, 2018.

Written Opinion of the International Searching Authority for International Application No. PCT/US2017/062773 filed Nov. 21, 2017, dated Mar. 21, 2018.

Office Action, TW Application No. 106140266, filed Nov. 21, 2017, dated Jul. 9, 2019. (Cited with the Original Document and a Full Text Translation).

EPO Communication under Rule 161, EP Application No. 17812163.8, filed Nov. 21, 2017, dated Jul. 26, 2019.

Office Action, TW Application No. 106140266, filed Nov. 21, 2017, dated Jul. 20, 2018. (Cited with the Original Document and a Full Text Translation).

Search Report, TW Application No. 106140266, filed Nov. 21, 2017, dated Jul. 20, 2018. (Cited with the Original Document and a Full Text Translation).

Written Opinion and Search Report, SG Application No. 11201904517T, filed Nov. 21, 2017, dated Apr. 20, 2020.

Office Action, Korean Application No. 10-2019-7014783, filed Nov. 21, 2017, dated Jul. 23, 2020. (Cited with the Original Document and Full Text Translation).

Office Action, Chinese Application No. 2017800723727, filed Nov. 21, 2017, dated Oct. 26, 2020. (Cited with the Original Document and Full Text Translation).

Office Action in Corresponding KR Application No. 10-2019-7014783, filed May 22, 2019, dated Jan. 22, 2021.

* cited by examiner

PHOTONICS INTERPOSER OPTOELECTRONICS

CROSS REFERENCE TO RELATED APPLICATIONS

This application claims the benefit of priority of U.S. Provisional Application No.: 62/426,100 filed Nov. 23, 2016 entitled "Photonics Interposer Optoelectronics" which is incorporated herein by reference in its entirety.

GOVERNMENT RIGHTS STATEMENT

This invention was made with government support under the Department of Defense (DOD) of the United States, under grant number FA8650-15-2-5220. The government may have certain rights in the invention.

FIELD

The present disclosure relates to photonics generally and specifically to photonics structures and processes for fabrication.

BACKGROUND

Commercially available photonics integrated circuits are fabricated on wafers, such as bulk silicon or silicon-on-insulator wafers. Commercially available prefabricated photonics integrated circuit chips can include waveguides for transmission of optical signals between different areas of a prefabricated photonics integrated circuit chip. Commercially available waveguides are of rectangular or ridge geometry and are fabricated in silicon (single or polycrystalline) or silicon nitride. Commercially available photonics integrated circuit chips are available on systems having a photonics integrated circuit chip disposed on a printed circuit board.

BRIEF DESCRIPTION

The shortcomings of the prior art are overcome, and additional advantages are provided, through the provision, in one aspect, of a photonics structure.

In one embodiment an optoelectronic system can include a photonics interposer having a substrate and a functional interposer structure formed on the substrate, a plurality of through vias carrying electrical signals extending through the substrate and the functional interposer structure, and a plurality of wires carrying signals to different areas of the functional interposer structure. The system can further include one or more photonics device integrally formed in the functional interposer structure; and one or more prefabricated component attached to the functional interposer structure.

Additional features and advantages are realized through the techniques of the present disclosure.

BRIEF DESCRIPTION OF THE SEVERAL VIEWS OF THE DRAWINGS

One or more aspects of the present disclosure are particularly pointed out and distinctly claimed as examples in the claims at the conclusion of the specification. The foregoing and other objects, features, and advantages of the disclosure are apparent from the following detailed description taken in conjunction with the accompanying drawings in which:

DETAILED DESCRIPTION

Aspects of the present disclosure and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the disclosure in detail. It should be understood, however, that the detailed description and the specific examples, while indicating aspects of the disclosure, are given by way of illustration only, and not by way of limitation. Various substitutions, modifications, additions, and/or arrangements, within the spirit and/or scope of the underlying inventive concepts will be apparent to those skilled in the art from this disclosure.

Figure 1:
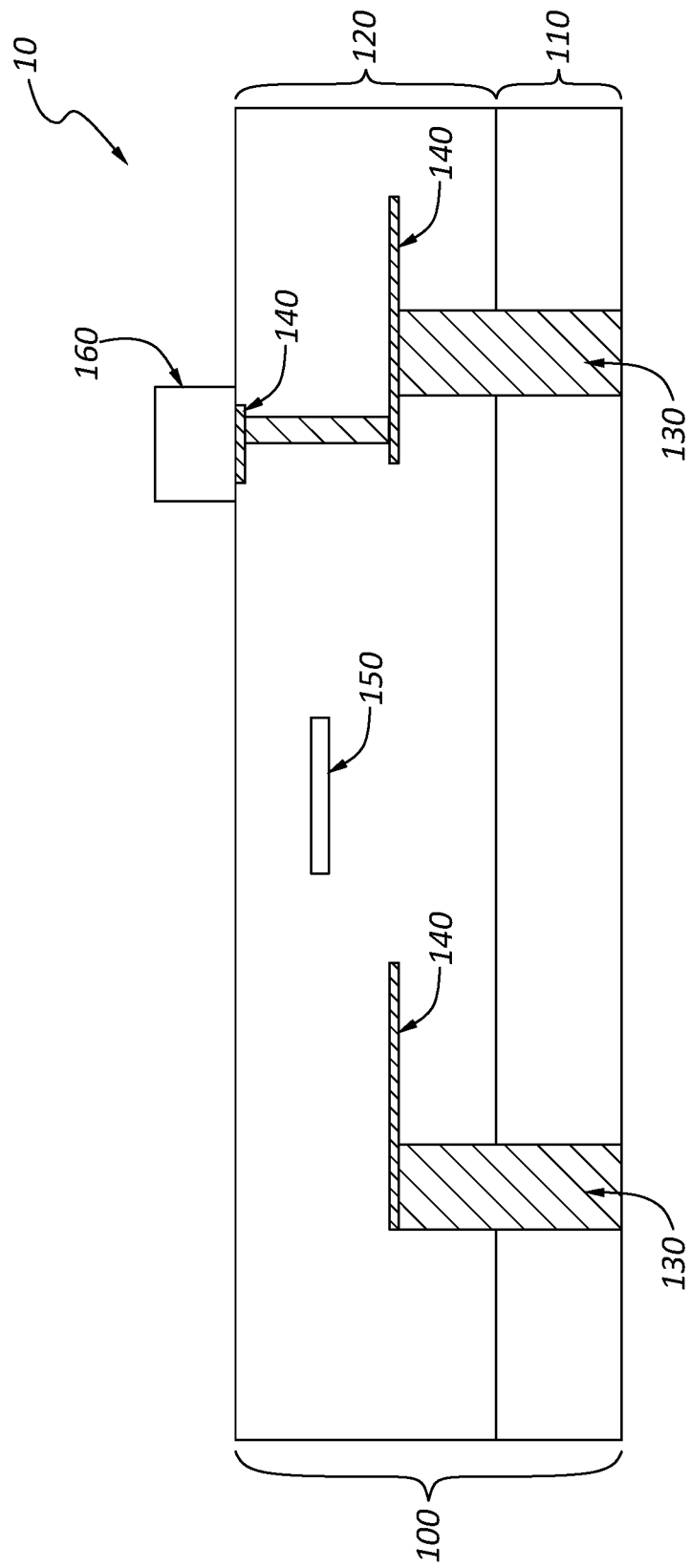
FIG. 1 is a cross sectional schematic view of an optoelectronic system having an interposer one or more attached prefabricated component and one or more integrated photonics device.

Referring to the schematic view of FIG. 1 there is shown an embodiment of an optoelectronic system 10. An optoelectronic system 10 can include a photonics interposer 100 having a substrate 110 and a functional interposer structure 120 formed on the substrate 110, a plurality of through vias 130 extending through the substrate 110. Optoelectronic system 10 can include one or more prefabricated component 160 attached to the functional interposer structure 100, and one or more photonics device 150 formed in the functional interposer structure 120.

One or more prefabricated component 160 can include one or more prefabricated component selected from the group including a prefabricated laser die chip, a prefabricated photonics integrated circuit chip or a prefabricated semiconductor chip. A prefabricated semiconductor chip can be a chip with active and/or passive electrical devices (CMOS, RF components, MEMs, discrete components).

One or more photonics device formed integral with functional interposer structure 120 can include e.g. one or more photonics device, e.g. one or more of a waveguide, a photodetector, a coupler, a modulator, a polarizer, a splitter or a resonator.

A method for fabricating an optoelectronics system 10 in one embodiment is described with reference to FIGS. 2-6.

Figure 2:
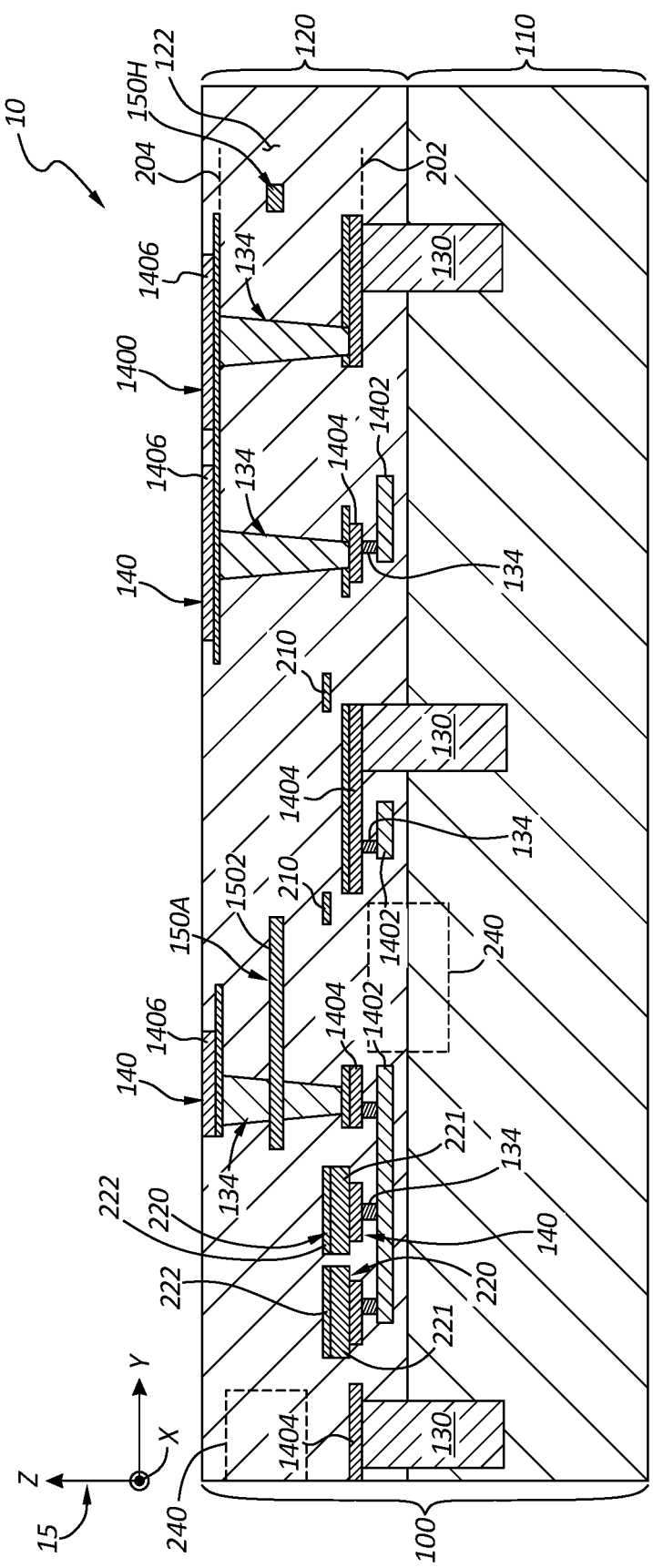
FIG. 2 is cross sectional schematic view of an optoelectronic system in an intermediary stage of fabrication.

Referring to FIG. 2 there is shown an optoelectronics system 10 in a preliminary stage of fabrication. Optoelectronics system 10 can include a substrate 110 and functional interposer structure 120. Substrate 110 can be formed of various alternative materials e.g. Si, SiO$_2$, glass, or sapphire. Functional interposer structure 120 can be fabricated by appropriate depositing and patterning using multiple interposer materials layers, which layers can define a major body of functional interposer structure 120. Interposer material layers defining a major body 122 of functional interposer structure 120 can include e.g. Si, SiO$_2$ or a combination of layers having such materials.

Functional interposer structure 120 can include one or more feature formation layers (e.g. one or more metallization layer, hard stop layer, or photonics device e.g. waveguiding material layer) for formation of functional features and interposer material layers in areas between functional features formed in functional interposer structure 120. Interposer material intermediate of functional features defining major body 122 of functional interposer structure 120 can provide e.g. one or more of electrical isolation, optical isolation, structural integrity, or structural spacing. Interposer material layers defining functional interposer structure 120 where formed of dielectric material can be referred to as "the dielectric stack" of interposer 100.

In one embodiment, as shown in FIG. 2 functional interposer structure 120 can be a multilayer structure having layers in which there can be defined various features. Through vias 130 which extend through substrate 110 and functional interposer structure 120 can be formed by appropriate patterning, for example masking after depositing of interposer material layer to elevation 202, etching to define through vias trenches, filling the through vias trenches with conductive material and planarizing to elevation 202 prior to depositing of metalization layer 1404. Vias 134 extending through functional interposer structure 120 can be formed by appropriate patterning, for example masking after depositing of one or more interposer material layers to elevation 202 (for lower elevation vias) or elevation 204 (for upper elevation vias), etching to define vias trenches, filling the vias trenches with conductive material and planarizing to elevation 202 (for lower elevation vias) or 204 (for upper elevation vias) prior to depositing of metallization layer 1404 (for lower elevation vias) or metalization layer 1406 (for upper elevation vias).

Metallization layer 1402 and metallization layer 1404 and metallization layer 1406 define wires 140. Wires 140 defined by metallization layers 1402, 1404, and 1406 can be horizontally extending through areas of functional interposer structure 120. Metallization layers 1402, 1404, and 1406 can be formed generally by depositing one or more interposer material layer to at least top elevation of the respective metallization layer 1402, 1404, or 1406, etching to define cavities for receiving conductive material, filling the cavities with conductive material, and then planarizing to the top elevation of the respective metallization layer 1402, 1404, or 1406. Metallization layers 1402, 1404, and 1406 can also be formed generally by depositing uniform thickness metallization layers, and then masking and etching to remove layer material from unwanted areas. Metallization layers 1402, 1404, and 1406 can be formed from metal or other conductive material. Wires 140 defined by metallization layer 1402 can be electrically connected to one or more vias 130 for distribution of one or more of control logic and/or power signals vertically and horizontally to different areas of functional interposer structure 120. Wires 140 defined by metallization layer 1404 can be electrically connected to one or more of vias 134 for distribution of one or more of electrical control, logic and/or power signals horizontally between different areas of functional interposer structure 120. Wires 140 defined by metallization layer 1406 can be electrically connected to one or more vias 134 for distribution of one or more of control, logic and/or power signals horizontally to different areas of functional interposer structure 120.

Functional interposer structure 120 can have formed therein an alignment feature 210 provided by a hard stop material layer for aligning of a prefabricated component. Embodiments herein recognize that improvement operational aspects of prefabricated components can be realized by providing for precision alignment. In the embodiment of FIG. 2 alignment feature 210 can be provided by a layer of hard stop material deposited over an interposer material layer. Alignment feature 210 provided by a hard stop material layer can be deposited at a precise elevation of functional interposer structure 120 for providing precision vertical alignment of a prefabricated component as set forth herein for attachment of the prefabricated component to functional interposer structure 120. Precision elevation control can permit reduced loss edge coupling between photonics devices. Alignment feature 210 provided by a hard stop material layer can be formed of a material having different etch selectivity relative to a material layer defining major body 122 of functional interposer structure 120. Alignment feature 210 provided by a hard stop material layer can be deposited to a thickness from about 10 nm to about 200 nm and in one embodiment between about 20 nm and 80 nm. For fabrication of alignment feature 210 interposer material can be deposited over a hard stop material layer defining alignment feature 210 and then can be etched back for formation of cavity 402 to reveal alignment feature 210. In one embodiment, where major body 122 is formed of SiO$_2$, alignment feature 210 can be formed of a material having etch selectivity differentiated from SiO$_2$, e.g. titanium nitride, carbon silicon nitride, or amorphous silicon.

Figure 4:
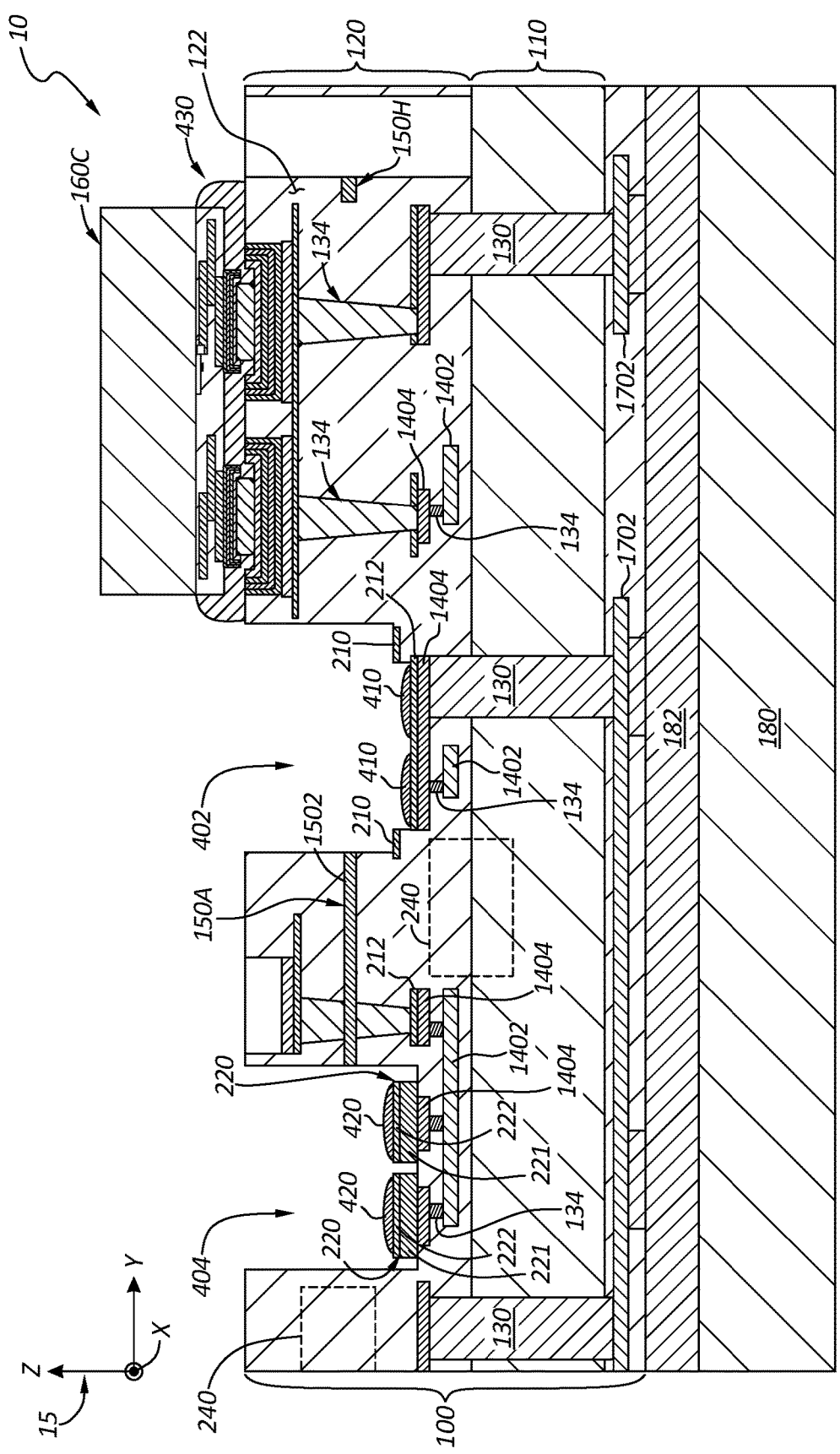
FIG. 4 is cross sectional schematic view of an optoelectronic system in an intermediary stage of fabrication after fabrication for accommodation of one or more prefabricated components.

Referring to additional features shown in the intermediary fabrication stage view of FIG. 2 system 10 can include alignment features 220 provided by metal stacks. Alignment features 220 provided metal stacks shown in an intermediary stage of fabrication in FIG. 2 can include metal pillars 221, barrier layer 222, and formations 420 (shown in the later stage view of FIG. 4). Alignment features 220 provided by metal stacks can provide vertical alignment along an axis running parallel to the z axis of reference coordinate system 15 to precisely vertically align a prefabricated component to be attached to functional interposer structure 120 so that elevation of the prefabricated component can be precisely established. Precision elevation control can permit reduced loss edge coupling between photonics devices. Alignment features 220 provided by metal stacks can be fabricated to have a predetermined total thickness within a small tolerance so that a distance between metallization layer 1404 and a top elevation of metal stacks defining alignment feature 220 can be precisely established. In general, top elevation formations 420 (e.g. formed of metal bump formations or plating formations) (FIG. 4) can be subject to heating and reflow for connection of a prefabricated component thereto. The distribution and volume of formations 420 as well as heating parameters can be controlled so that an elevation of metal stacks defining alignment feature 220 is not unexpectedly impacted by reflow of formations 420 (FIG. 4).

Referring to additional features shown in the intermediary fabrication stage view of FIG. 2 system 10 can include one or more photonics device formed integral with functional interposer structure 120. As shown in the FIG. 2 one or more photonics device formed integral with functional interposer structure 120 can include waveguide 150A defined by waveguiding material layer 1502. In one embodiment, waveguide 150A can be fabricated by depositing waveguiding material layer 1502, masking and etching to remove unwanted areas of waveguiding material layer 1502 and depositing an interposer material layer over the remaining portion of the waveguiding material layer. Waveguiding material layer 1502 defining waveguide 150A can include e.g. monocrystalline silicon, polycrystalline silicon, amorphous silicon, silicon nitride, or silicon oxynitride. Waveguides fabricated of different materials within functional interposer structure 120 can be used for performance of different functions. For example, waveguides formed of silicon might be selected for fabrication of waveguides included in active devices such as photodetectors or modulators. Dielectric waveguides (e.g. formed of silicon nitride) can be adapted for transmission of optical signals to longer distances. Other materials such as amorphous silicon might be selected for applications where a balance of current conduction properties and light conduction properties is emphasized. Patterning of waveguide 150A can include patterning of material defining waveguide 150 as well as patterning of material surrounding the waveguide 150A having an index of refraction differentiated from an index of refraction of a material of waveguide 150A. Patterning of waveguide 150A can include patterning to define different alternative geometries.

Figure 8:
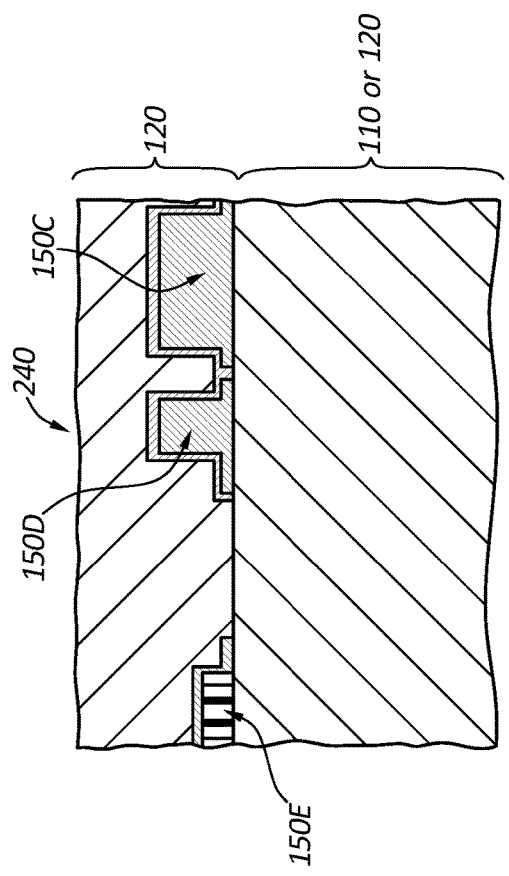
FIGS. 7-10 illustrate alternative embodiments of photonics devices that can be integrally formed in an interposer functional structure.
Figure 10:
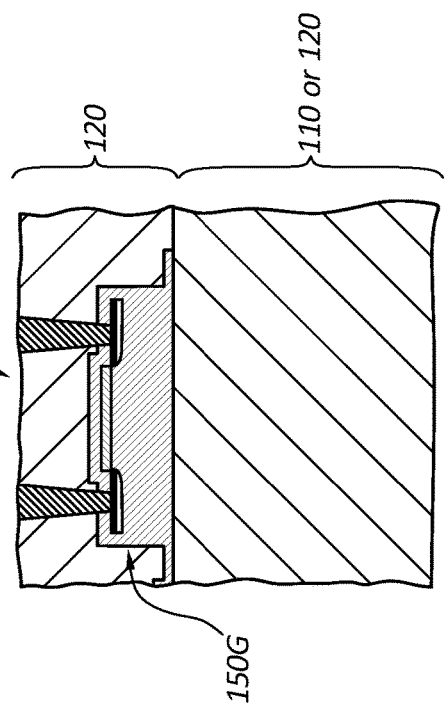
Figure 7:
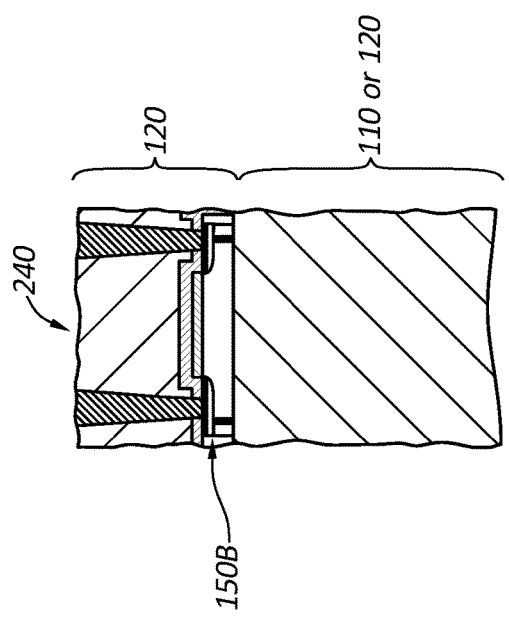
Figure 9:
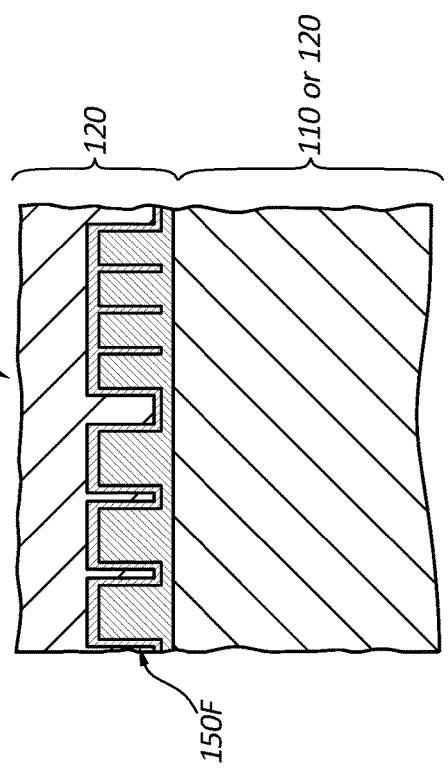

Functional interposer structure 120 can include one or more integrally formed photonics device in addition to or in place of one or more waveguide such as waveguide 150. For example functional interposer structure 120 can include one or more integrated photonics region such as photonics region 240 which can be formed e.g. at location A formed on substrate 110 or location B formed in functional interposer structure 120 at an elevation above a substrate 110 of interposer 100. As shown in FIG. 7, integrated photonics region 240 can include one or more layer defining functional interposer structure 120 patterned to define a photodetector 150B. As shown in FIG. 8, integrated photonics region 240 can include one or more layer defining functional interposer structure 120 patterned to define waveguides 150C, 150D, 150E of different dimensions, shapes, and materials. As shown in FIG. 9, integrated photonics region 240 can include one or more layer defining functional interposer structure 120 patterned to define a grating coupler 150F. As shown in FIG. 10, integrated photonics region 240 can include one or more layer defining functional interposer structure 120 patterned to define a modulator 150G. In one embodiment, interposer 100 can include photonics region 240 distributed throughout interposer 100, and interposer 100 can include each of the integrated photonics devices 150B-150G described with reference to FIGS. 7-10. In one embodiment, photonics regions 240 represents a photonics region fabricated to define one or more of a polarizer, a splitter or a resonator.

In some embodiments, material forming photonics devices, e.g. monocrystalline silicon, polycrystalline silicon, germanium, can be epitaxially grown. Embodiments herein recognize that while a thick layer of silicon may accommodate epitaxially growing a resulting photonics device may exhibit light losses through the thick silicon layer. In one embodiment, for accommodating epitaxially growth of epitaxially growth material, a structure having seed layer of silicon (a silicon template) on an insulator can be provided. For providing a structure having a seed layer of silicon, a silicon on insulator (SOI) wafer (having a thin layer of oxide on a bulk silicon substrate and a thin layer of silicon on the oxide) can be selected for use in fabricating substrate 110. In one embodiment where an SOI wafer is used for fabrication of interposer 100, substrate 110 is provided by a bulk silicon substrate of a SOI wafer.

Epitaxially growing can also be performed by epitaxially growing on a seed layer of silicon formed on glass. Accordingly, selection of a silicon on glass wafer (having a thin silicon layer formed on a bulk glass substitute) for fabrication of substrate 110 can accommodate epitaxial growth of epitaxial growth material and fabrication of photonics devices formed of epitaxially grown material such as monocrystalline silicon, polycrystalline silicon or germanium. In one embodiment where a silicon on glass wafer is used for fabrication of interposer 100, substrate 110 is provided by a glass substrate of a silicon on glass wafer.

In one embodiment functional interposer structure 120 can be fabricated to include a silicon on insulator interface at an elevation above substrate 110. For example, a thick layer of silicon above a top elevation of substrate 110, e.g. epitaxially grown on a substrate 110 where formed of silicon, can be subject to separation by local or non-local implanted oxygen (SIMOX) processing to define a thin silicon layer and buried oxide layer below the thin silicon layer.

With appropriate fabrication methodologies photonic devices provided by or having waveguides of different waveguiding material can be fabricated at any elevation of functional interposer structure 120. In one embodiment, epitaxially grown photonic devices can be fabricated at on substrate locations of functional interposer structure 120, and photonic devices formed of deposited materials, e.g. formed of deposited silicon nitride or silicon oxynitride can be formed at an above substrate elevation of functional interposer structure 120. Functional interposer structure 120 can be fabricated to conduct light between elevations by evanescent coupling between waveguides at different elevations.

Various processes can be performed for modifying a grain structure of a material layer from which various photonics devices can be fabricated. In one embodiment, a material layer can be formed of polycrystalline silicon (polysilicon). In one embodiment, ion implantation can be performed to modify the silicon crystal structure of a material layer. On modification, polysilicon material can be transformed into amorphous polysilicon material. Ion implant species can include one or more of silicon, argon (e.g., Ar or Ar+), xenon (e.g., Xe or Xe+) or germanium. In another aspect, an annealing process, e.g., a recrystallization annealing process can be performed to further improve a grain structure of a material layer. In one embodiment, with or without ion implantation, a material layer can be subject to annealing for modification of a grain structure.

For enhancing performance of photonics devices integrally formed in interposer functional structure 120, interposer 100 can include features for reducing coupling between integrally fabricated photonics devices and substrate 110. In one embodiment, substrate 110 can be formed of glass for reduction of coupling. In one embodiment substrate 110 can include deep trench isolation features in regions of interposer 100 in which photonics devices are integrally formed.

Figure 3:
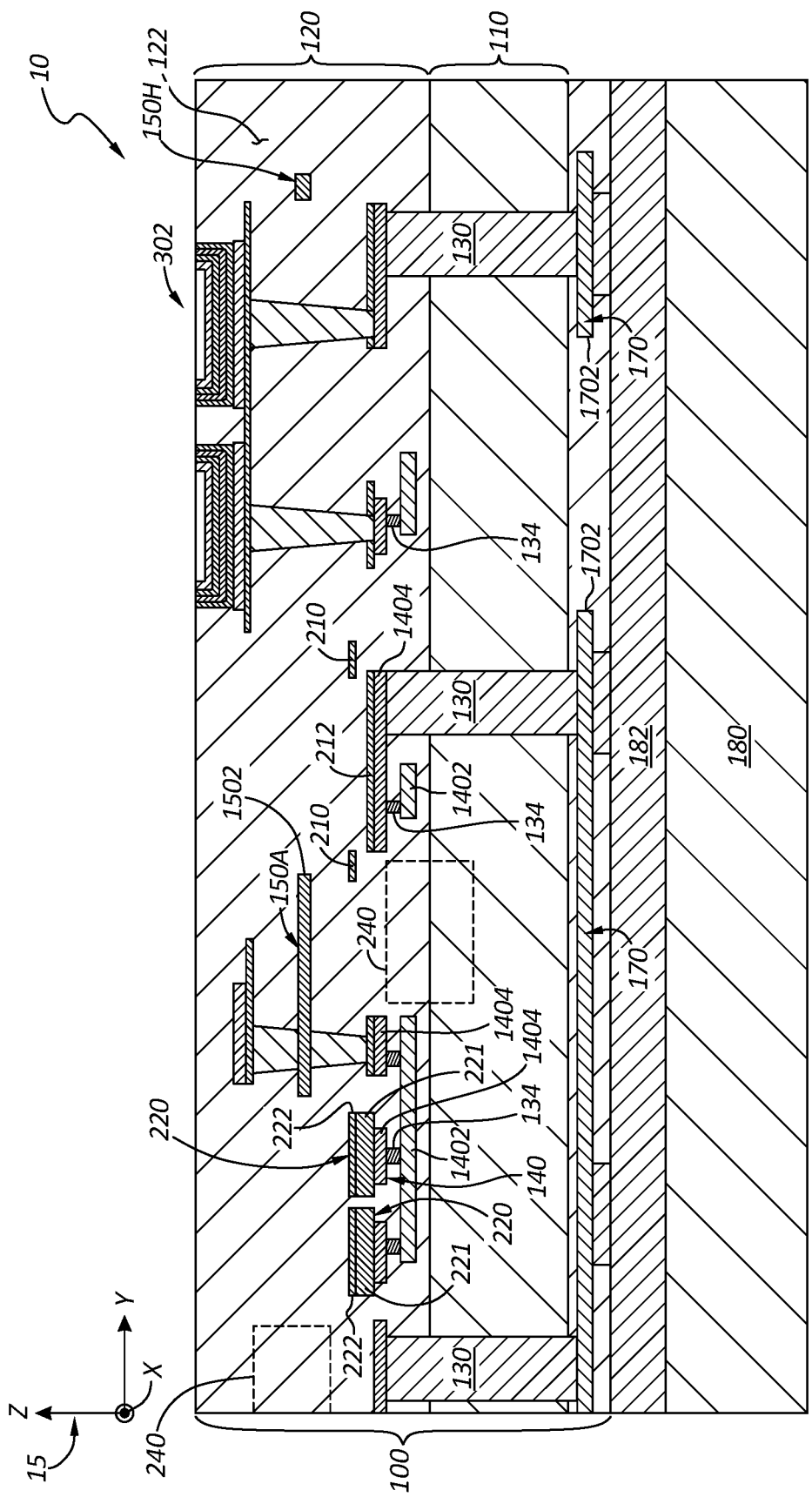
FIG. 3 is cross sectional schematic view of an optoelectronic system in an intermediary stage of fabrication after fabrication of a redistribution layer.

FIG. 3 illustrates the optoelectronics system 10 of FIG. 2 in a subsequent intermediary stage of fabrication. Referring to FIG. 3 substrate 110 can be grinded to reveal conductive material of through vias 130 and additional patterning can be performed for formation of redistribution layer wiring 170. For example an interposer material layer e.g. being of the material defining major body 122 can be deposited on substrate 110 after grinding of substrate planarized to a bottom elevation of through vias 130 in the stage shown in FIG. 2, followed by depositing of redistribution layer 1702, masking and etching to remove unwanted material of redistribution layer 1702 to define redistribution layer wiring 170 and depositing of another one or more layer of interposer material, then recessing that one or more layer in areas for accommodated of under bump metallization formations. In another embodiment, one or more interposer material layer e.g. being of the material defining major body 122 can be deposited, etched to define cavities for receiving conductive material, and such cavities can be filled with conductive material to define redistribution layer 1702 followed by depositing an additional one or more interposer material layer and recessing in the areas depicted for accommodated of under bump metallization formations. In one embodiment, a photoresist stencil can be applied and filled with conductive material for formation of redistribution layer 1702.

Through vias 130 and vias 134 can distribute control, logic and/or power signals between a backside of interposer 100 and interposer functional structure 120. Through vias 130 and vias 134, wires 140, and wiring 170, can facilitate fan out of electrical control and power signals. In one example, metallized layers 1402 1404 and 1406 can have pitches on respective nanometer scales and redistribution layer 1702 can have a pitch on a micron scale. Materials for use in fabrication of redistribution layer 1702 and metallization layers 1402 1404 and 1406 can include metals e.g. copper, silver, gold, tungsten, or other conductive material, or other conductive material, e.g. appropriately doped semiconductor material.

Prior to fabrication processing for formation of backside features including redistribution layer 1702, a frontside handle wafer (not shown) having the general configuration of handle wafer 180 can be temporarily attached to a frontside of interposer 100 (the frontside of interposer 100 having functional interposer structure 120) using an adhesive layer having the general configuration of adhesive layer 182. Such frontside handle wafer permits interposer 100 to be oriented in a backside up orientation for fabrication processing for formation of backside features including redistribution layer 1702. Subsequent to fabrication processing for formation of backside features including redistribution layer 1702 a backside handle wafer 180, e.g. with use of adhesive layer 182, can be temporarily attached to interposer 100 as shown in FIG. 3 and the frontside handle wafer can be removed. Backside handle wafer 180 permits interposer 100 to be oriented in a frontside up orientation as shown in FIG. 3 for fabrication processing of additional features, e.g. formation of features of area 302, formation of cavities 402 and 404, and attachment of prefabricated components 160A, 160B, and 160B.

Through vias 130 and vias 134 can be vertically extending. In one embodiment, through vias 130 can extend through substrate 110 and can also extend though functional interposer structure 120. In one embodiment, through vias 130 can extend through substrate 110 by extending entirely (completely) through substrate 110 and can extend though functional interposer structure 120 by extending partially through substrate 110. In one embodiment, vias 134 can extend though functional interposer structure 120 by extending partially through functional interposer structure 120.

Referring to further aspects of FIG. 3 additional fabrication processing at area 302 can be performed to accommodate attachment of a prefabricated component. In one embodiment where the prefabricated component is a prefabricated semiconductor chip having solder bumps processing at area 302 can include fabrication processing to fabricate under bump metallization (UBM) formations.

Figure 5:
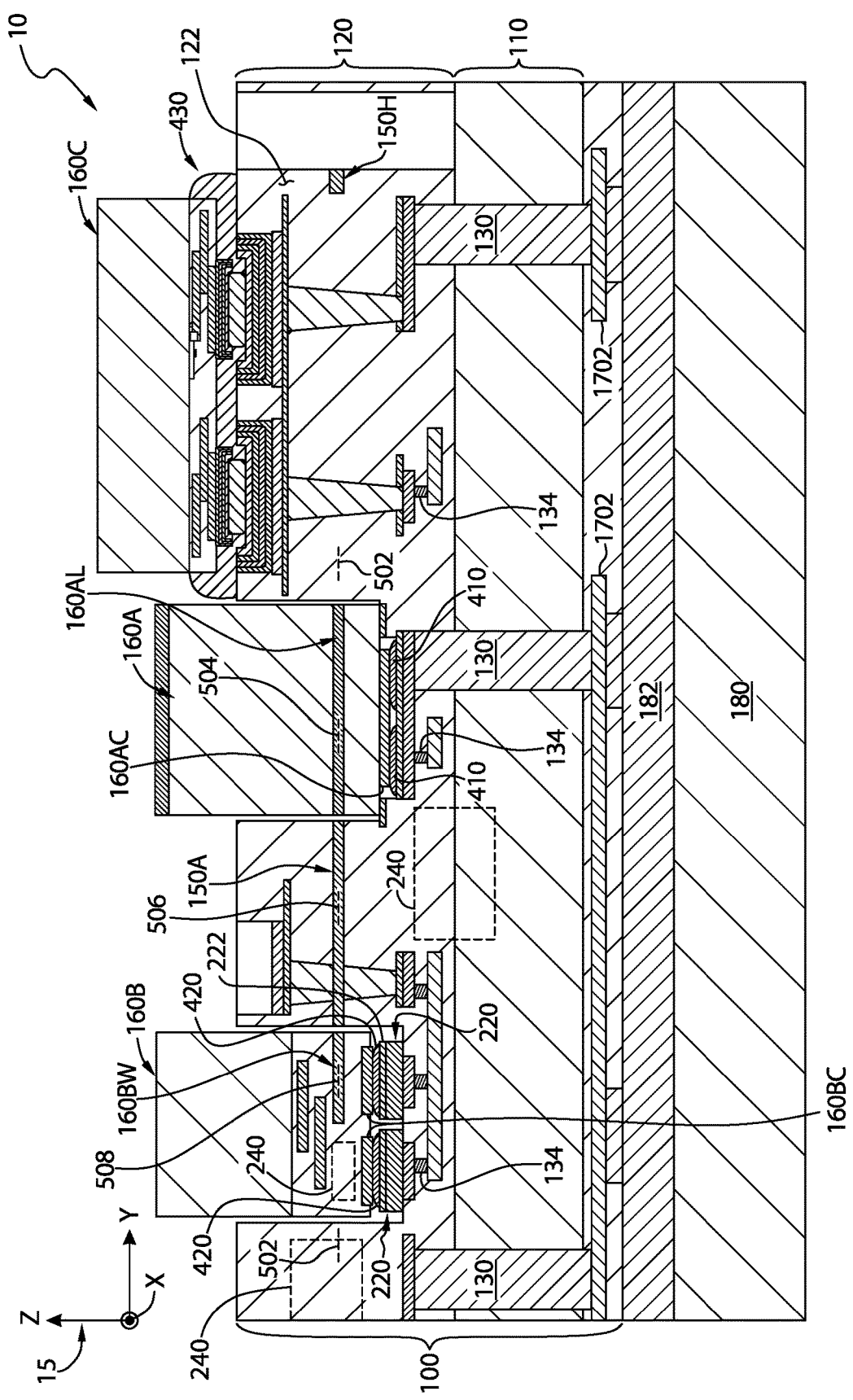
FIG. 5 is cross sectional schematic view of an optoelectronic system in an intermediary stage of fabrication after attachment of one or more prefabricated components.

FIG. 4 illustrates the optoelectronics system 10 of FIG. 3 in a subsequent intermediary stage of fabrication. Referring to FIG. 4 cavity 402 can be formed for accommodation of a prefabricated component provided by a prefabricated laser die chip 160A (FIG. 5) and cavity 404 can be formed for accommodation of a prefabricated component provided by a prefabricated photonics integrated circuit chip 160B (FIG. 5). Formations 410 can be formed in cavity 402 for facilitating electrical and mechanical coupling of wires 140 to a prefabricated component and formations 420 can be formed in cavity 404 on barrier layer 222 for facilitating electrical and mechanical coupling of wire 140 to a prefabricated component. Formations 420 can complete fabrication of alignment feature 220 provided by metals stacks shown in an intermediary stage of fabrication in FIG. 3. Formations 410 can be formed on barrier layer 212 which can be formed on metallization layer. Formation 420 can be formed on barrier layer 222. Barrier layer 222 in turn can be formed in metal pillars 221 which can be formed on metallization layer 1404. Barrier layers 212 and 222 can form a barrier to inhibit reactions that may result from gold or tin of contacts 160AC and 160BC of respective prefabricated components such as prefabricated laser die chip 160A and prefabricated photonics integrated circuit chip 160B contacting metallization layer 1404 or pillars 211.

Formations 410 and/or formations 420 in one embodiment can be formed of solder bumps. Formations 410 and/or formations 420 in one embodiment can be formed of thin coherent metal coatings (e.g. electroless plating formations or electroplating plating formations) yielded using an electroless plating process or an electroplating process. According to one embodiment, an electroless plating process can be provided by a chemical or auto catalytic non-galvanic process that involves reactions in an aqueous solution without use of external power. In one embodiment for performance of electroless plating, hydrogen can be released by a reducing agent to produce a negative charge on a surface. Electroless plating can include e.g. electroless nickel plating, electroless silver plating, electroless gold plating, or electroless copper plating. According to one embodiment of an electroplating process electric current can be used to reduce dissolve metal cations so that they form a thin metal coating on an electrode. In one embodiment a plating process (e.g. an electroless plating or electroplating process) can be used for precision control of an amount and distribution of material forming formation 410 and/or formation 420, thus reducing thickness variations resulting from reflow of material forming formations 410 and/or formations 420.

In another aspect as shown in FIG. 4 prefabricated semiconductor chip 160C can be attached at area 430. Prefabricated semiconductor chip 160C can be a semiconductor chip with active or passive electrical devices (CMOS, RF components, MEMs, discrete components). Processing at area 430 can include processing to solder bumps of prefabricated semiconductor chip 160C to under bump metallization formations (UBM). Prefabricated semiconducter chip 160C can be a chip with active and/or passive electrical devices (CMOS, SRAM, Logic, ASIC, RF components, MEMs, discrete components).

FIG. 5 illustrates the optoelectronics system 10 of FIG. 4 in a subsequent intermediary stage of fabrication. Referring to FIG. 5, prefabricated laser die chip 160A can be attached to functional interposer structure 120 within cavity 402, and prefabricated photonics integrated circuit chip 160B can be attached to functional interposer structure 120 within cavity 404.

For attachment of prefabricated laser die chip 160A, prefabricated laser die chip 160A can be lowered downward until a bottom elevation of prefabricated laser die chip 160A at an area adjacent to contacts 160AC of prefabricated laser die chip 160A contacts alignment feature 210. When prefabricated laser die chip 160A contacts alignment feature 210 formations 410 can be subject to localized laser heating using a laser heating tool to electrically and mechanically connect prefabricated laser die chip 160A to functional interposer structure 120. Localized laser heating can cause formations 410 to reflow and electrical and mechanical coupling between metallization layer 1404 and contacts 160AC of prefabricated laser die chip 160A can be established. Prefabricated laser die chip 160A can emit laser light of a predetermined or variable wavelength. Prefabricated laser die chip 160A can incorporate one or more laser light emission technologies, e.g. DFB, Fabry-Perot, WDM.

For attachment of prefabricated photonics integrated circuit chip 160B to functional interposer structure 120, prefabricated photonics integrated circuit chip 160B can be pressed downward until contacts 160BC of prefabricated photonics integrated circuit chip 160B contact alignment feature 220 provided by metal stacks having metal pillars 221, barrier layer 222 and formation 420. The attachment assembly as shown for attaching chip 160B at cavity 404 can rely on controlled thickness of alignment feature 220 provided by metal stacks so that vertical alignment can be provided based on contacts of prefabricated photonics integrated circuit chip 160B contacting formations 420 so that chip is at a certain elevation at which chip 160B can essentially remain after reflow of formation 420. When contacts 160BC of prefabricated photonics integrated circuit chip 160B contact alignment feature 220 formations 420 can be subject to localized laser heating using a laser heating tool. With prefabricated photonics integrated circuit chip 160B contacting alignment feature 220 provided by metal stacks localized laser heating can cause formations 420 to reflow and electrical and mechanical coupling between metallization layer 1404 and contacts 160BC of prefabricated laser die chip 160B can be established.

Prefabricated photonics integrated circuit chip 160B can be a prefabricated photonics integrated circuit chip for various applications e.g. biomedical, WDM, datacom, analog RF, mobile, LIDAR, optical networking, and the like. Prefabricated photonics integrated circuit chip 160B can include one or more photonics device e.g. waveguides 150A and/or one or more photonics device 150B-150G of photonics region 240 fabricated as set forth herein in reference to FIGS. 7-10, e.g. one or more photonics device such as a waveguide, a photodetector, coupler, modulator, polarizer, splitter or a resonator.

For attachment of prefabricated laser die chip 160A and prefabricated photonics integrated circuit chip 160B to functional interposer structure 120, prefabricated laser die chip 160A and prefabricated photonics integrated circuit chip 160B can be located in their respective cavities 402 and 404 using a chip bonding tool having machine vision functionality. Alignment features 210 and 220 can provide vertical alignment (in directions parallel to the z axis of the reference coordinate system 15 shown throughout the views associated to interposer 100) so that an elevation of prefabricated laser die chip 160A and prefabricated photonics integrated circuit chip can be precisely established. Recognizable patterns can be included in interposer 100 to facilitate alignment of prefabricated laser die chip 160A and prefabricated photonics integrated circuit chip 160B both in directions along an axis that runs parallel to the y axis of reference coordinate system 15 in directions along an axis that runs parallel to the x axis of reference coordinate system 15. Patterns recognizable by machine vision pattern recognition can be conveniently fabricated with patterns defined by metallization layer 1402 and/or metallization layer 1404.

Alignment feature 210 which can operate to vertically align and establish a precision elevation of prefabricated laser die chip 160A can be spaced apart from and independent of features for electrical connection of laser die chip 160A and functional interposer structure 120. As such requirements for locating and providing conductive material for purposes of electrical connectivity can be expected to have less of an effect on the vertical alignment of chip 160A. The attachment assembly for attaching prefabricated photonics integrated circuit chip 160B at cavity 404 can operate independent of alignment feature 210 and can remove from a design configuration alignment feature 210.

Although the attachment assembly for attaching a prefabricated laser die chip 160A at cavity 402 and the attachment assembly for attaching prefabricated photonics integrated circuit chip 160B at cavity 404 are shown as different attachment assemblies in the specific embodiment of FIG. 4, common attachment assemblies can alternatively be used. For example the attachment assembly for attaching prefabricated laser die chip 160A at cavity 402 could be used for attaching prefabricated laser die chip 160A at cavity 402 and for attaching prefabricated photonics integrated circuit chip 160B at cavity 404. In another embodiment the attachment assembly shown for attaching prefabricated photonics integrated circuit chip 160B at cavity 404 can be used to attach prefabricated laser die chip 160A at cavity 402 and to attach prefabricated photonics integrated circuit chip 160B at cavity 404. In an alternative embodiment the attachment assembly shown for attaching prefabricated laser die chip 160A at cavity 402 could be used for attaching prefabricated photonics integrated circuit chip 160B at cavity 404 and the attachment assembly for attaching prefabricated photonics integrated circuit chip 160B at cavity 404 can be used for attaching prefabricated laser die chip 160A at cavity 402.

With prefabricated laser die chip 160A attached to functional interposer structure 120 as shown in FIG. 5, prefabricated laser die chip 160A can be vertically aligned (in a direction running parallel to the z axis of reference coordinate system 15) to waveguide 150A integrally formed in functional interposer structure 120 so that a light emission layer 160AL of chip 160A is vertically aligned to waveguide 150A. Prefabricated laser die chip 160A can be z axis aligned as well as x and y axis aligned to integrally formed waveguide 150 (in directions running parallel to the x axis and y axis of reference coordinate system 15). With chip 160A and waveguide 150A so aligned, prefabricated laser die chip 160A and waveguide 150A can be edge coupled to one another. According to one embodiment, an edge coupling between prefabricated laser die chip 160A and waveguide 150A can include an optical coupling of reduced insertion loss, leading to enhanced system and signal integrity. Edge coupling can include light receiving waveguide 150A being tapered for further reduction of light losses.

With prefabricated photonics integrated circuit chip 160B attached to functional interposer structure 120 as shown in FIG. 4, prefabricated photonics integrated circuit chip 160B can be vertically aligned (in a direction running parallel to the z axis of reference coordinate system 15) as well as x and y axis aligned (in directions running parallel to the x axis and y axis of reference coordinate system 15) to waveguide 150A integrally formed in functional interposer structure 120 so that waveguide 160BW of prefabricated photonics integrated circuit chip 160B is aligned to waveguide 150A and accordingly at a common elevation with waveguide 150A. With chip 160B and waveguide 150A so aligned, prefabricated photonics integrated circuit chip 160B and waveguide 150 can be edge coupled to one another. According to one embodiment, an edge coupling between prefabricated photonics integrated circuit chip 160B and waveguide 150 can include an optical coupling of reduced insertion loss, leading to enhanced system and signal integrity. Edge coupling can include light receiving waveguide 160BW being tapered for further reduction of light losses.

As shown in FIG. 5, with prefabricated laser die chip 160A and prefabricated photonics integrated circuit chip 160B attached to functional interposer structure 120, light emission layer 160AL of prefabricated laser die chip 160A, integrally formed waveguide 150A integrally formed in functional interposer structure 120, and waveguide 160BW of prefabricated photonics integrated circuit chip 160B can be aligned along a common horizontal axis 502 and can be disposed at a common elevation. Light emission layer 160AL of prefabricated laser die chip 160A, integrally formed waveguide 150 integrally formed in functional interposer structure 120, and waveguide 160BW in one embodiment can each be provided by straight linear shaped structure having respective axes 504, 506, and 508 that run parallel to an x axis of reference coordinate system 15. Aligning light emission layer 160AL of prefabricated laser die chip 160A, integrally formed waveguide 150A integrally formed in functional interposer structure 120, and waveguide 160BW of prefabricated photonics integrated circuit chip 160B as described can reduce light transmission losses which may result e.g. from diffraction or reflection from internal components of functional interposer structure 120.

In another aspect explained with reference to the fabrication view of FIG. 5, interposer 100 can be configured so that through vias 130 provide heat sinking functionality to remove heat generated by heat generating features of prefabricated laser die chip 160A and prefabricated photonics integrated circuit chip 160B. Where substrate 110 is formed of thermally conductive material e.g. silicon, interposer 100 can be configured so that heat conducted by through vias 130 can be conducted by substrate and redistribution layer 1702 for removal of heat from interposer 100. Where substrate 110 is formed of thermally insulating material e.g. SiO$_2$ or glass, interposer 100 can be configured so that heat conducted by through vias 130 can be conducted primarily by redistribution layer 1702 for removal of heat from interposer 100.

Figure 6:
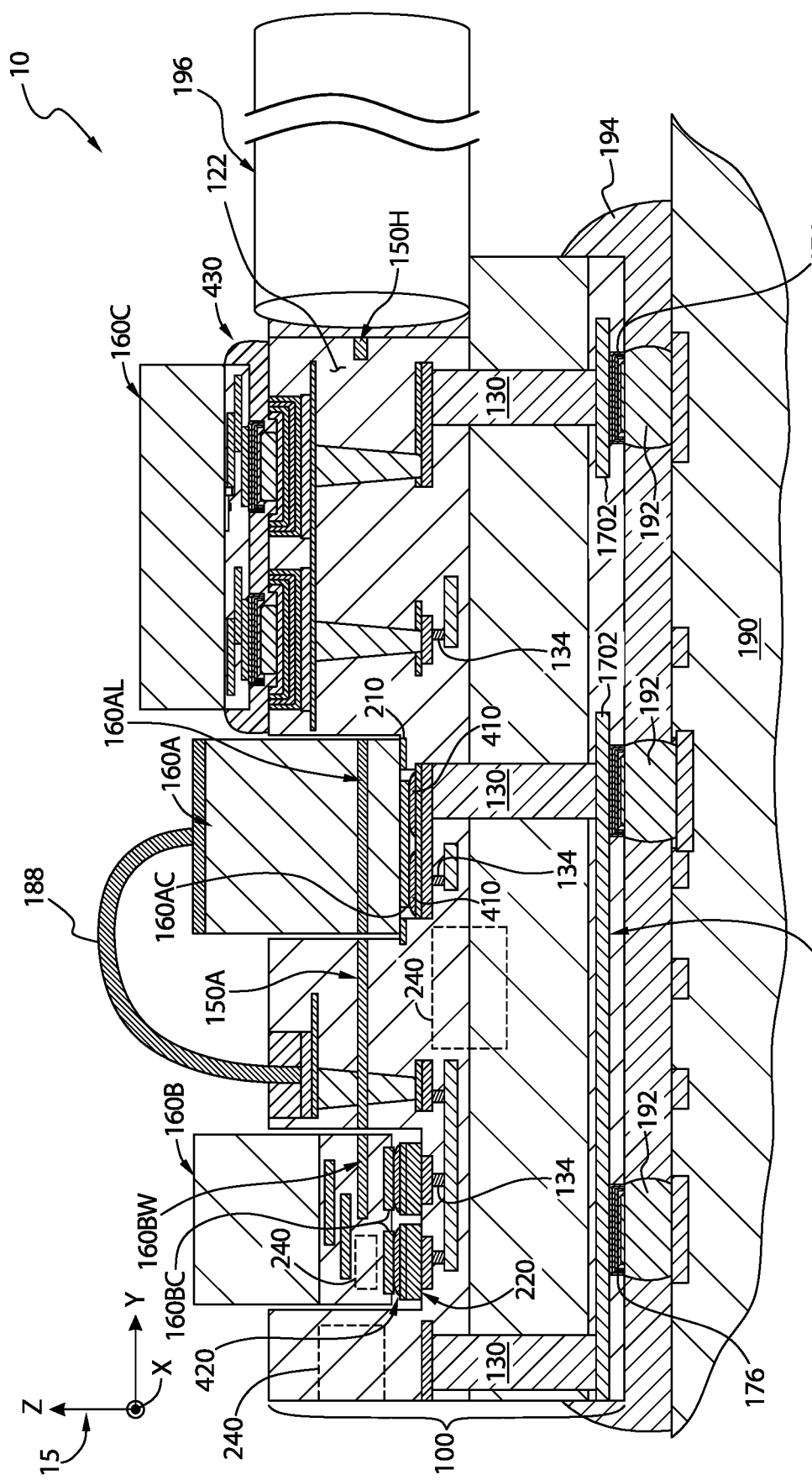
FIG. 6 is cross sectional schematic view of an optoelectronic system installed on a substructure.

For further fabrication processing, under bump metallization (UBM) formations 176 as shown in FIG. 6 can be formed on exposed areas of redistribution layer 1702 on a backside of interposer 100 (the exposed areas being where the interposer material surrounding redistribution layer 1702 is shown as being recessed). Such UBM formations 176 can be adapted to receive solder bumps of a substructure to which interposer 100 can be attached. A handle wafer (not shown) can be temporarily attached to functional interposer structure 120 via an adhesive to permit handling and installation of optoelectronics system 10 on a substructure such as a printed circuit board or interposer.

FIG. 6 illustrates system 10 mounted on a substructure 190 by way of connection of solder bumps 192 of interposer 100 to UBM formations 176. Shown as being provided by a printed circuit board substructure 190 can alternatively be provided e.g. by a ball grid array or an interposer. Interposer 100 in the fabrication stage as shown in FIG. 6 can include a wire bond 188 for wire bonding of an electrode of prefabricated laser die chip 160A to an exposed voltage terminal of functional interposer structure 120. Alternatively, the area of formations 410 of functional interposer structure 120 can be configured to define electrically isolated positive and negative voltage terminal and a prefabricated laser die chip 160A having the bottom electrode shown configured as separated positive and negative terminal electrodes can be attached to the corresponding positive and negative voltage terminals in the area of formations 410. External laser light can be coupled to functional interposer structure 120. For example a fiber optic cable 196 carrying light from an external off-interposer source (not shown) can be coupled to integrated waveguide 150H integrally formed in functional interposer structure 120. Light receiving waveguide 150H can be tapered for reduction of light losses. For electrical and mechanical connection of interposer 100 to substructure 180, UBM formations 176 of interposer 100 can be soldered to corresponding solder bumps 192 of substructure 190, and sealed with a sealant 194.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Forms of the term "defined by" encompass relationships where an element is partially defined by as well relationships where an element is entirely defined by. Numerical identifiers herein, e.g. "first" and "second" are arbitrary terms to designate different elements without designating an ordering of elements. Furthermore, a system method or apparatus that is configured in a certain way is configured in at least that way, but may also be configured in ways that are not listed. Furthermore, a system method or apparatus set forth as having a certain number of elements can be practiced with less than or greater than the certain number of elements.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. An optoelectronic system comprising:
   a photonics interposer having a substrate and a functional interposer structure formed on the substrate, a plurality of through vias carrying electrical signals extending through the substrate and the functional interposer structure, and a plurality of wires carrying electrical signals to different areas of the functional interposer structure;
   one or more photonics device integrally formed in the functional interposer structure; and
   one or more prefabricated component attached to the functional interposer structure, wherein the one or more photonics device includes a dielectric waveguide, the dielectric waveguide having a bottom elevation above a top elevation of a metallization layer formed within the functional interposer structure, the metallization layer defining a wire of the plurality of wires.

2. The optoelectronic system of claim 1, wherein the one or more prefabricated component includes a component selected from the group consisting of a prefabricated laser die chip, a prefabricated photonics integrated circuit chip and a prefabricated semiconductor chip.

3. The optoelectronic system of claim 1, wherein the interposer includes a cavity, and wherein the one or more prefabricated component includes a prefabricated chip electrically connected to the metallization layer and disposed in the cavity, wherein the prefabricated chip is selected from the group consisting of a prefabricated laser die chip and a prefabricated photonics integrated circuit chip.

4. The optoelectronic system of claim 1, wherein the dielectric waveguide is formed of nitride.

5. An optoelectronic system comprising:
   a photonics interposer having a substrate and a functional interposer structure formed on the substrate, a plurality of through vias carrying electrical signals extending through the substrate and the functional interposer structure, and a plurality of wires carrying electrical signals to different areas of the functional interposer structure;
   one or more photonics device integrally formed in the functional interposer structure; and
   one or more prefabricated component attached to the functional interposer structure, wherein the one or more prefabricated component includes a prefabricated chip having a horizontally extending structure, wherein the one or more photonics device integrally formed in the functional interposer structure includes an integrally formed elongated waveguide extending horizontally in the functional interposer structure, and wherein the functional interposer structure defines a cavity, the cavity being adapted to receive the prefabricated chip so that the integrally formed elongated waveguide extending horizontally in the functional interposer structure couples to the horizontally extending structure of the prefabricated chip.

6. The optoelectronic system of claim 5, wherein the one or more prefabricated component attached to the functional interposer structure includes a prefabricated laser die chip attached at the cavity of the functional interposer structure, and wherein the prefabricated laser die chip has a horizontally extending emission layer aligned with the integrally formed elongated waveguide extending horizontally in the functional interposer structure.

7. The optoelectronic system of claim 5, wherein the one or more prefabricated component attached to the functional interposer structure includes a prefabricated photonics integrated circuit chip attached at the cavity of the functional interposer structure, the prefabricated photonics integrated circuit chip having an elongated horizontally extending waveguide aligned with the integrally formed elongated waveguide extending horizontally in the functional interposer structure.

8. The optoelectronic system of claim 5, wherein the one or more prefabricated component attached to the functional interposer structure includes a prefabricated laser die chip attached at the cavity of the functional interposer structure, wherein the prefabricated laser die chip has a horizontally extending emission layer aligned with the integrally formed elongated waveguide extending horizontally in the functional interposer structure, and wherein the one or more prefabricated component attached to the functional interposer structure includes a prefabricated photonics integrated circuit chip attached at a second cavity of the functional interposer structure, the prefabricated photonics integrated circuit chip having an elongated horizontally extending waveguide aligned with the integrally formed elongated waveguide extending horizontally in the functional interposer structure.

9. The optoelectronic system of claim 5, wherein the one or more prefabricated component attached to the functional interposer structure includes a prefabricated laser die chip attached at the cavity of the functional interposer structure, wherein the prefabricated laser die chip has a horizontally extending emission layer aligned with the integrally formed elongated waveguide extending horizontally in the functional interposer structure, wherein the one or more prefabricated component attached to the functional interposer structure includes a prefabricated photonics integrated circuit chip attached at a second cavity of the functional interposer structure, the prefabricated photonics integrated circuit chip having an elongated horizontally extending waveguide aligned with the integrally formed elongated waveguide extending horizontally in the functional interposer structure, and wherein the photonics interposer is mounted to a substructure, the substructure being a substructure selected from the group consisting of a printed circuit board, a ball grid array package and an interposer.

10. The optoelectronic system of claim 5, wherein the one or more prefabricated component attached to the functional interposer structure includes a prefabricated laser die chip attached at the cavity of the functional interposer structure, wherein the prefabricated laser die chip has a horizontally extending emission layer aligned with the integrally formed elongated waveguide extending horizontally in the functional interposer structure, wherein the one or more prefabricated component attached to the functional interposer structure includes a prefabricated photonics integrated circuit chip attached at a second cavity of the functional interposer structure, the prefabricated photonics integrated circuit chip having an elongated horizontally extending waveguide aligned with the integrally formed elongated waveguide extending horizontally in the functional interposer structure, wherein the one or more prefabricated component attached to the functional interposer structure includes a prefabricated semiconductor chip and wherein the photonics interposer is mounted to a printed circuit board, and wherein the prefabricated semiconductor chip is a chip selected from the group consisting of a CMOS chip, an RF component chip, a MEMs chip, and a discrete component chip.

11. The optoelectronic system of claim 5, wherein a bottom of the cavity is defined by a conductive material formation and a dielectric alignment feature, wherein the dielectric alignment feature is adapted to contact the prefabricated chip at a location of the prefabricated chip other than an electrical contact of the prefabricated chip.

12. The optoelectronic system of claim 5, wherein a bottom of the cavity includes an alignment feature configured to facilitate elevational alignment of the prefabricated chip for which the cavity is adapted to receive, the alignment feature including a conductive material formation, the conductive material formation being configured so that on reflow of the conductive material formation the integrally formed elongated waveguide extending horizontally in the functional interposer structure is at a common elevation with the horizontally extending structure of the prefabricated chip.

13. The optoelectronic system of claim 5, wherein the functional interposer structure defines a dielectric stack, wherein a bottom of the cavity includes an alignment feature configured to facilitate elevational alignment of the prefabricated chip for which the cavity is adapted to receive, the alignment feature including a dielectric alignment structure integrally formed at a bottom of the cavity as part of the dielectric stack, wherein the bottom of the cavity includes a conductive material formation adapted for electrical connection to an electrical contact of the prefabricated chip, wherein the dielectric alignment structure is adapted to contact the prefabricated chip at a location of the prefabricated chip other than the electrical contact so that elevational alignment of the prefabricated chip within the cavity is independent of an electrical connection between the conductive material formation and the electrical contact.

14. The optoelectronic system of claim 5, wherein the optoelectronic system is configured so that when the prefabricated chip is received in the cavity the horizontally extending structure of the prefabricated chip and the horizontally extending waveguide are aligned along a common horizontal axis.

15. The optoelectronic system of claim 5, wherein the optoelectronic system is configured so that when the prefabricated chip is received in the cavity the horizontally extending structure of the prefabricated chip and the horizontally extending waveguide are edge coupled to one another.

16. The optoelectronic system of claim 5, wherein the integrally formed elongated waveguide extending horizontally in the functional interposer structure is a dielectric waveguide, wherein the optoelectronic system is adapted so that when the prefabricated chip is received in the cavity the integrally formed elongated waveguide extending horizontally in the functional interposer structure is at a common elevation with the horizontally extending structure of the prefabricated chip, and wherein the optoelectronic system is configured so that when the prefabricated chip is received in the cavity, the horizontally extending structure of the prefabricated chip and the horizontally extending waveguide are aligned along a common horizontal axis, wherein the functional interposer structure includes horizontally extending nanometer scale metallization layer defining a wire of the plurality of wires, the integrally formed elongated waveguide extending horizontally in the functional interposer structure having a bottom elevation above a top elevation of a metallization layer formed within the functional interposer structure, wherein a through via of the plurality of through vias terminates at a through via top elevation within the functional interposer structure, wherein the through via top elevation is below a bottom elevation of a photonics device of the integrally formed elongated waveguide extending horizontally in the functional interposer structure, and wherein formed on a backside of the substrate defining the photonics interposer, there is a micron scale horizontally extending redistribution layer.

17. A method for fabrication of the optoelectronic system of claim 16, wherein the method comprises deposing dielectric material on the substrate to a certain elevation, forming a trench having a top elevation at the certain elevation and a bottom elevation at a particular elevation within the substrate; filling the trench with metal to define the through via so that the through via extends through the substrate and the dielectric material; fabricating the integrally formed elongated waveguide extending horizontally in the functional interposer structure above the certain elevation; removing bottom elevations of the substrate to reveal the through via on a bottom side of the substrate; and forming the micron scale redistribution layer on the bottom side of the substrate.

18. The optoelectronic system of claim 5, wherein the integrally formed elongated waveguide extending horizontally in the functional interposer structure is a dielectric waveguide, wherein there is integrally formed within the functional interposer below an elevation of the dielectric waveguide a photodetector, wherein the optoelectronic system is adapted so that when the prefabricated chip is received in the cavity the integrally formed elongated waveguide extending horizontally in the functional interposer structure is at a common elevation with the horizontally extending structure of the prefabricated chip, and wherein the optoelectronic system is configured so that when the prefabricated chip is received in the cavity, the horizontally extending structure of the prefabricated chip and the horizontally extending waveguide are aligned along a common horizontal axis, wherein the functional interposer structure includes horizontally extending nanometer scale metallization layer defining a wire of the plurality of wires, the integrally formed elongated waveguide extending horizontally in the functional interposer structure having a bottom elevation above a top elevation of a metallization layer formed within the functional interposer structure, wherein a through via of the plurality of through vias terminates at a through via top elevation within the functional interposer structure, wherein through via top elevation is below a bottom elevation of a photonics device of the integrally formed elongated waveguide extending horizontally in the functional interposer structure, and wherein formed on a backside of the substrate defining the photonics interposer there is a micron scale horizontally extending redistribution layer in electrical communication with the through via, wherein a bottom elevation of the cavity is above a top elevation of the nanometer scale metallization layer, and wherein the nanometer scale metallization layer is formed on the through via, and wherein the nanometer scale metallization layer is in communication with conductive formations at a bottom of the cavity for electrically connecting to the prefabricated component, wherein a bottom of the cavity includes an alignment feature configured to facilitate elevational alignment of the prefabricated chip for which the cavity is adapted to receive, the alignment feature including a conductive material formation, the conductive material formation being configured so that on reflow of the conductive material formation, the integrally formed elongated waveguide extending horizontally in the functional interposer structure is at a common elevation with the horizontally extending structure of the prefabricated chip, the conductive material formation being configured so that the common elevation is essentially the elevation of the prefabricated chip prior to the reflow of the conductive material formation, and wherein functional interposer structure has integrally formed therein a horizontally extending nitride waveguide, wherein the functional interposer structure is adapted to receive a horizontally extending fiber optic cable having an elevation in common with the horizontally extending nitride waveguide, the horizontally extending nitride waveguide receiving light from the horizontally extending fiber optic cable.

19. An optoelectronic system comprising:
   a photonics interposer having a substrate and a functional interposer structure formed on the substrate, a plurality of through vias carrying electrical signals extending through the substrate and the functional interposer structure, and a plurality of wires carrying electrical signals to different areas of the functional interposer structure;
   one or more photonics device integrally formed in the functional interposer structure; and
   one or more prefabricated component attached to the functional interposer structure, wherein the one or more photonics device includes a horizontally extending waveguide, the horizontally extending waveguide having a bottom elevation above a top elevation of a metallization layer formed within the functional interposer structure, the metallization layer defining a wire of the plurality of wires.

20. The optoelectronic system of claim 19, wherein a via of the plurality of through vias terminates at a top elevation within the functional interposer structure, wherein the top elevation is below a bottom elevation of a photonics device of the one or more photonics device.

\* \* \* \* \*